(12) United States Patent
Yanagawa et al.

(10) Patent No.: US 6,787,457 B2
(45) Date of Patent: Sep. 7, 2004

(54) METHOD OF ETCHING AND ANTI-REFLECTION FILM USING SUBSTITUTED HYDROCARBON WITH HALOGEN GAS

(75) Inventors: Shusaku Yanagawa, Kanagawa (JP); Masatsugu Ikeda, Kagoshima (JP); Kenichi Kubo, Kagoshima (JP); Youichi Goto, Kagoshima (JP)

(73) Assignee: Sony Corporation, Tokyo (JP)

( * ) Notice: Subject to any disclaimer, the term of this patent is extended or adjusted under 35 U.S.C. 154(b) by 32 days.

(21) Appl. No.: 10/107,495

(22) Filed: Mar. 27, 2002

(65) Prior Publication Data

US 2002/0142486 A1 Oct. 3, 2002

(30) Foreign Application Priority Data

Mar. 28, 2001 (JP) .................................... P2001-092252

(51) Int. Cl.$^7$ ......................................... H01L 21/4763
(52) U.S. Cl. ........................ 438/639; 438/636; 438/638; 438/640; 438/673; 438/706
(58) Field of Search .................... 438/20, 72, 636–640, 438/952, 706, 709–711, 714, 629, 668, 612

(56) References Cited

U.S. PATENT DOCUMENTS 5,656,128 A * 8/1997 Hashimoto et al. ........... 216/47
5,882,999 A * 3/1999 Anderson et al. ........... 438/629
6,214,637 B1 * 4/2001 Kim et al. .................. 438/152
6,589,879 B2 * 7/2003 Williams et al. ............ 438/714

OTHER PUBLICATIONS

Wolf et al. "Silicon Processing for the VLSI ERA" 1986, vol. 1, pp. 547–551.*

* cited by examiner

*Primary Examiner*—Thanh Nguyen
(74) *Attorney, Agent, or Firm*—Sonnenschein, Nath & Rosenthal LLP

(57) ABSTRACT

A portion, positioned at an opening portion of a resist, of an anti-reflection film is etched using an etching gas containing a substituted hydrocarbon with a halogen. At the time of etching of the anti-reflection film, a carbon component of the substituted hydrocarbon with a halogen is formed as a carbonaceous deposit on side walls, less irradiated with ions, of the opening portion of the resist, and on side walls of an opening portion, formed by etching, of the anti-reflection film. The deposit acts as a side wall blocking film, to suppress lateral extension of the opening portion of the resist and the opening portion of the anti-reflection film by etching, thus allowing anisotropic etching of the anti-reflection film. With this etching method, it is possible to etch the anti-reflection film with a resist taken as a mask while suppressing a variation in pattern dimension.

5 Claims, 6 Drawing Sheets

METHOD OF ETCHING AND ANTI-REFLECTION FILM USING SUBSTITUTED HYDROCARBON WITH HALOGEN GAS

RELATED APPLICATION DATA

The present application claims priority to Japanese Application(s) No(s). P2001-092252 filed Mar. 28, 2001, which application(s) is/are incorporated herein by reference to the extent permitted by law.

BACKGROUND OF THE INVENTION

The present invention relates to a method of fabricating a semiconductor device, and particularly to a method of fabricating a semiconductor device, in which an anti-reflection film is etched with a resist taken as a mask.

In recent years, as exemplified by VLSI (Very Large Scale Integration), semiconductor devices have become finer along with a trend toward a higher degree of integration and higher function thereof. As a result, to make a line width of such a semiconductor device fine, it is required to shorten a wavelength of exposure light used for photolithography, which wavelength determines a minimum line width, and therefore, it becomes difficult to control a dimension of the line width.

A related art method of forming a resist pattern has been carried out by forming a resist film on an under substrate, selectively exposing the resist film to light having a single wavelength, such as a g-ray (wavelength: 436 nm), an i-ray (wavelength: 365 nm), or a KrF excimer laser beam (wavelength: 248 nm), and developing the resist film with an alkali containing water solution. By the way, in the case of performing exposure using light having such a single wavelength, a shape of the resist may be often degraded due to light reflected from the under substrate. Such reflection of light from the under substrate is called "halation". On the other hand, at the time of patterning of the resist, a standing wave is generated by multi-interference of light in the resist film upon exposure, and in this case, if a thickness of the resist film is uneven depending on a difference-in-height of the under substrate, a quantity of incident light reaching an interface between the resist film and the under substrate and a quantity of reflected light from the interface between the resist film and the under substrate are varied depending on the uneven thickness of the resist film, with a result that a difference in quantity of light absorbed in the resist occurs between a thick portion and a thin portion of the resist film, to thereby vary a pattern dimension of the resist. In other words, an uneven thickness of the resist emerges as an uneven pattern dimension of the resist by the effect of the standing wave, so that it is difficult to accurately control the pattern dimension of the resist.

In fabrication of a semiconductor device, a variation in pattern dimension of a resist by halation and the standing wave effect causes problems associated with a variation in transistor characteristics, disconnection, short-circuit, and the like. In particular, a quantity of light absorbed in the resist, which is dependent on the standing wave effect, is finely changed depending on a light absorptivity of the resist film, a kind of an under substrate, and a difference-in-height of a surface of the under substrate, with a result that it is difficult to control a pattern dimension of the resist obtained after exposure and development. Such a problem commonly occurs for any kind of resist, and becomes more significant as a pattern dimension of a resist becomes finer.

To suppress such a standing wave effect, there has been proposed a method of providing an organic based anti-reflection film under a resist. The anti-reflection film contains a pigment capable of absorbing light having a wavelength used for exposure. Reflection of light from an under substrate can be perfectly shielded by optimizing a thickness of the anti-reflection film.

The formation of the anti-reflection film, however, has a problem. Since a composition of the anti-reflection film is closer to that of a resist, if an etching gas containing oxygen is used in a dry etching step for etching the anti-reflection film, the resist film may be etched at the time of etching the anti-reflection film, so that an opening portion of the resist becomes wider than that at the time of patterning by etching.

Another problem caused by formation of an anti-reflection film is as follows. If an under substrate has a difference-in-height, a thickness of the antireflection film formed thereon is varied depending on the difference-in-height of the under substrate, like the above-described variation in thickness of a resist. To be more specific, the anti-reflection film is thin at its portion positioned at an upper portion of the difference-in-height of the under substrate and is thin at its portion positioned at a lower portion of the difference-in-height of the under substrate. The variation in thickness of the anti-reflection film, generated at this stage, is dependent on a viscosity of a material of the anti-reflection film, and it becomes smaller when the viscosity of the material of the anti-reflection film becomes higher. The variation in thickness of the anti-reflection film, however, cannot be perfectly eliminated even by adjusting the viscosity of the material of the anti-reflection film. Accordingly, etching of the anti-reflection film must be performed under an etching condition optimized for a thick portion of the anti-reflection film. In this case, however, etching of a thin portion of the anti-reflection film becomes excessive, and thereby an opening portion of the resist is etched along with the etching of the anti-reflection film, to be extended in the lateral direction, thereby increasing a variation in pattern dimension of the resist.

A further problem caused by formation of an antireflection film is as follows. In the case where a thickness of an anti-reflection film is uneven, a variation in pattern dimension occurs in the antireflection film by the standing wave effect due to interference of incident light with reflected light. Such a dimensional variation is negligible if a thickness of the anti-reflection film is sufficiently large (0.2 $\mu$m or more); however, in this case, it is required to prolong an etching time for etching the anti-reflection film. Consequently, as described above, since a composition of the anti-reflection film is closer to that of a resist, etching of the anti-reflection film is accompanied by etching of the resist film, to extend an opening portion of the resist, thereby causing a variation in pattern dimension.

An additional problem caused by formation of an anti-reflection film is that an insulating film such as a silicon oxide film, formed under the anti-reflection film, must be etched by an etching system different from that used for etching the anti-reflection film after etching of the anti-reflection film, with a result that the number of etching steps is increased.

SUMMARY OF THE INVENTION

An object of the present invention is to provide a method of fabricating a semiconductor device, which is capable of etching an anti-reflection film with a resist taken as a mask while suppressing a variation in a dimension of a pattern.

Another object of the present invention is to provide a method of fabricating a semiconductor device, which is capable of continuously etching an anti-reflection film and an insulating film.

To achieve the above object, according to an aspect of the present invention, there is provided a method of fabricating a semiconductor device, in which an anti-reflection film is etched with a resist taken as mask, including the steps of: forming an insulating film on a wafer substrate and forming an anti-reflection film on the insulating film; forming a resist on the anti-reflection film and forming an opening portion in the resist; and removing a portion, positioned at the opening portion of said resist, of the anti-reflection film by etching using an etching gas containing a substituted hydrocarbon with a halogen.

With this configuration, at the time of etching the anti-reflection film, the substituted hydrocarbon with a halogen contained in the etching gas is formed as a carbonaceous deposit on side walls of an opening portion formed in the resist and side walls of an opening portion, formed by etching, of the anti-reflection film. The deposit acts as a side wall blocking film, which can suppress, even if a thickness of each of the resist and the anti-reflection film is uneven, lateral extension of the opening portion of the resist and the opening portion of the anti-reflection film. As a result, it is possible to perform anisotropic etching of the anti-reflection film, and hence to fabricate a semiconductor device with an accurately formed pattern.

Also, according to the present invention, etching characteristics such as an etching rate of the anti-reflection film, and an etching selection ratio of the anti-reflection film to the resist, and an etching selection ratio of an $SiO_2$ film to a polysilicon film can be controlled by changing a composition ratio of the substituted hydrocarbon with a halogen contained in the etching gas and a composition ratio of oxygen contained in the etching gas.

Further, according to the present invention, the underlying $SiO_2$ film can be continuously etched after etching of the anti-reflection film by optimizing the composition ratio of oxygen contained in the etching gas containing the substituted hydrocarbon with a halogen. As a result, it is possible to continuously etch the anti-reflection film and the $SiO_2$ film by the same etching system and hence to reduce the number of steps and improve the fabrication efficiency.

BRIEF DESCRIPTION OF THE DRAWINGS

These and other objects of the invention will be seen by reference to the description, taken in connection with the accompanying drawing, in which.

DETAILED DESCRIPTION OF THE PREFERRED EMBODIMENT

Hereinafter, a preferred embodiment of the present invention will be described with reference to the drawings.

Figure 1:
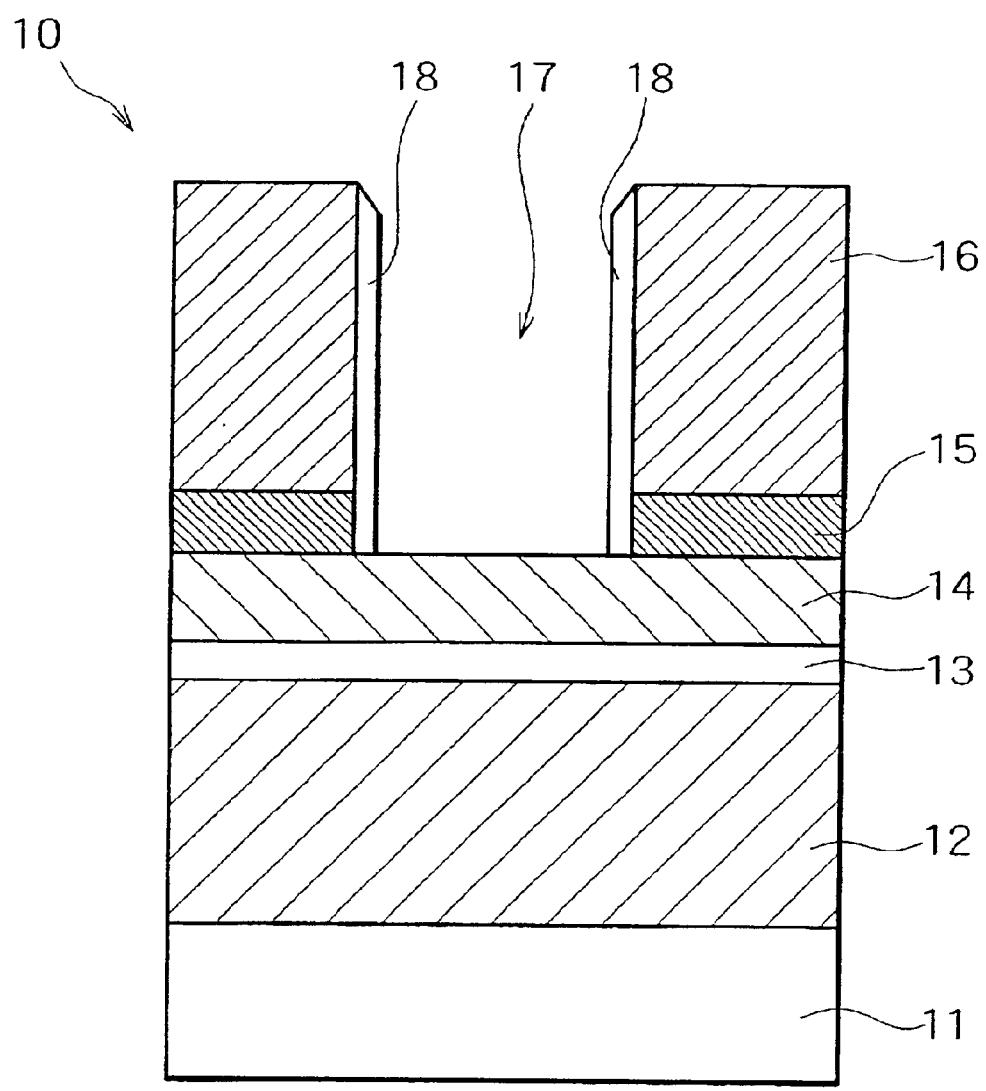
FIG. 1 is a sectional view showing an opening portion of a semiconductor device according to an embodiment of the present invention.

FIG. 1 is a sectional view of an opening portion of a semiconductor device fabricated by a method of fabricating a semiconductor device according to an embodiment of the present invention.

Referring to FIG. 1, there is shown a semiconductor device 10 including a silicon substrate 11, a device isolation oxide 12 formed in a surface region of the silicon substrate 11 by an LOCOS (Local Oxidation of Silicon) process, a polysilicon film 13 formed on both the silicon substrate 11 and the device isolation oxide 12 by a low pressure CVD process, a silicon dioxide ($SiO_2$) film 14 formed on the polysilicon film 13 by a normal pressure CVD process, an anti-reflection film 15 formed on the $SiO_2$ film 14 by a spin coat process, a resist 16 coated on the anti-reflection film 15, an opening portion 17 formed in the resist 16, and a carbonaceous deposit 18 formed on side walls of the opening portion 17.

The semiconductor device 10 configured as described above is fabricated by forming the device isolation oxide 12 in the surface region of the silicon substrate 11, sequentially forming the polysilicon film 13, the $SiO_2$ film 14, and the anti-reflection film 15 on both the silicon substrate 11 and the device isolation oxide 12, forming the resist 16 on the anti-reflection film 15, and forming the opening portion 17 in the resist 16 by patterning the resist 16. A portion, positioned at the opening 17, of the anti-reflection film 15 is then removed by using an etching gas containing a substituted hydrocarbon with a halogen. At the time of etching of the anti-reflection film 15, the substituted hydrocarbon with a halogen contained in the etching gas is deposited as a carbonaceous matter on side walls of the opening portion 17, to form the deposit 18. The deposit 18 acts as a side wall blocking film, to suppress lateral extension of the opening portion 17 of the resist 16, and also suppress lateral extension of an opening portion, formed by the etching, of the anti-reflection film 15, thereby allowing anisotropic etching of the anti-reflection film 15. As a result, it is possible to accurately form a pattern.

A method of fabricating a semiconductor device according to an embodiment of the present invention is described below.

FIGS. 2 to 5 are sectional views of fragmental structures of a semiconductor device, illustrating steps of fabricating the semiconductor device.

Figure 2:
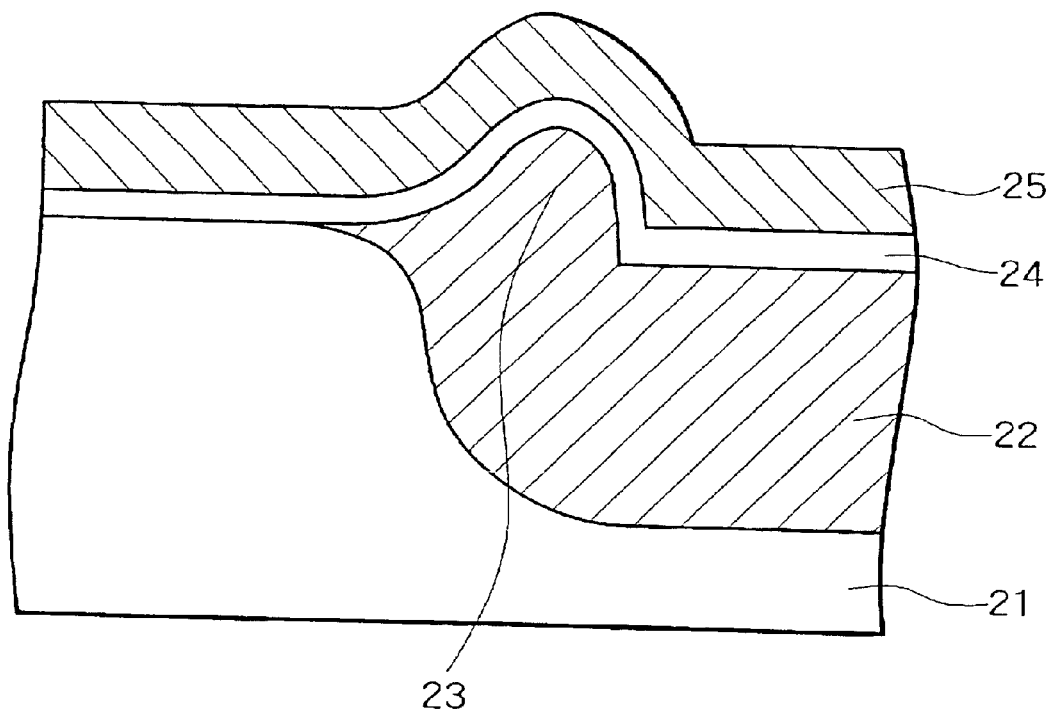
FIG. 2 is a view showing a state that a polysilicon film and an $SiO_2$ film are formed on a silicon substrate.

FIG. 2 is a view showing a state that a polysilicon film and an $SiO_2$ film are formed on a silicon substrate.

First, a device isolation oxide 22 is formed in a surface region of a silicon substrate 21 by the LOCOS process. At this time, a head 23 is formed on the device isolation oxide 22. A polysilicon film 24 having a thickness of 150 nm is formed on both the silicon substrate 21 and the device isolation oxide 22 having the head 23 by the low pressure CVD process, and then an $SiO_2$ film 25 having a thickness of 385 nm is formed on the polysilicon film 24 by the normal pressure CVD process.

Figure 3:
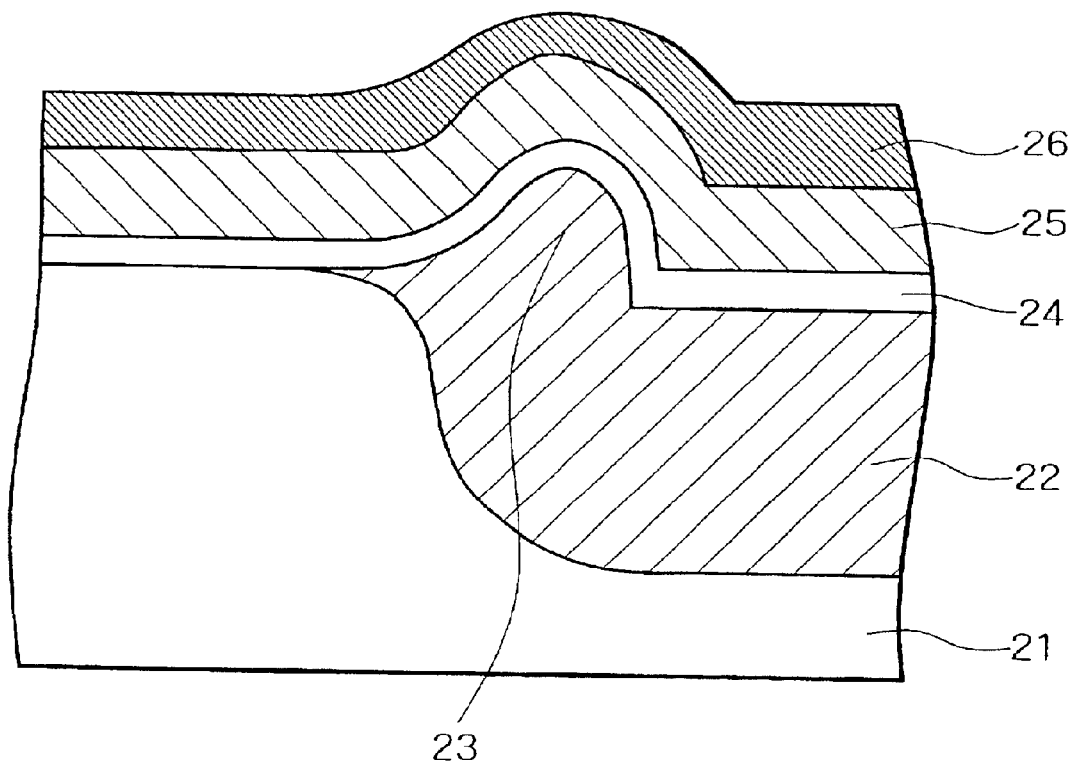
FIG. 3 is a view showing a state that an anti-reflection film is formed.

FIG. 3 is a view showing a state that an anti-reflection film is formed.

After the step shown in FIG. 2, an organic based anti-reflection film 26 is formed on the $SiO_2$ film 25 by the spin coat process. At this time, the anti-reflection film 26 has a thickness of 180 nm at its portion positioned over a device isolation region (that is, a region of the device isolation oxide 22), and has a thickness of 125 nm at its portion positioned over a device region (that is, a region out of the device isolation oxide 22). The thickness of the portion, over the device isolation region, of the anti-reflection film 26 is thus different from the thickness of the portion, over the device region, of the anti-reflection film 26 by the presence of the head 23.

Figure 4:
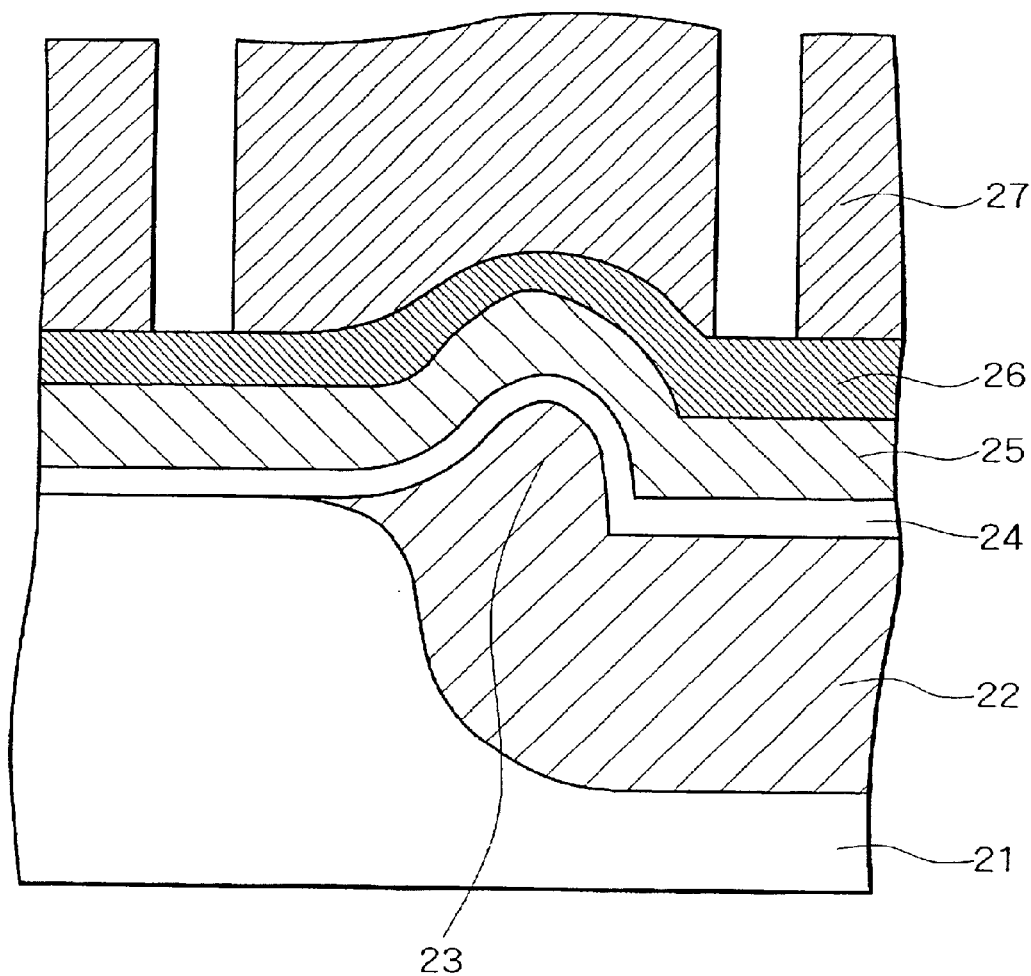
FIG. 4 is a view showing a state that a resist is formed.

FIG. 4 is a view showing a state that a resist is formed.

The anti-reflection film 26 is subjected to hard baking at 180° C., and a resist 27 is coated on the anti-reflection film 26 under a condition that if the resist 27 is coated on a silicon substrate on which any film is not formed, then a film thickness of the resist 27 becomes 1.31 $\mu$m. At this time, a thickness of the resist 27 becomes 1.31 $\mu$m at its portion positioned over the device isolation region, and becomes 1.25 $\mu$m at its portion positioned over the device region. Like the thickness of the anti-reflection film 26, the thickness of the portion, over the device isolation region, of the resist 27 is different from the thickness of the portion, over the device region, of the resist 27 by the presence of the head 23. The resist 27 is then patterned by an i-ray stepper, to form opening portions each having a width of 1.70 $\mu$m.

Figure 5:
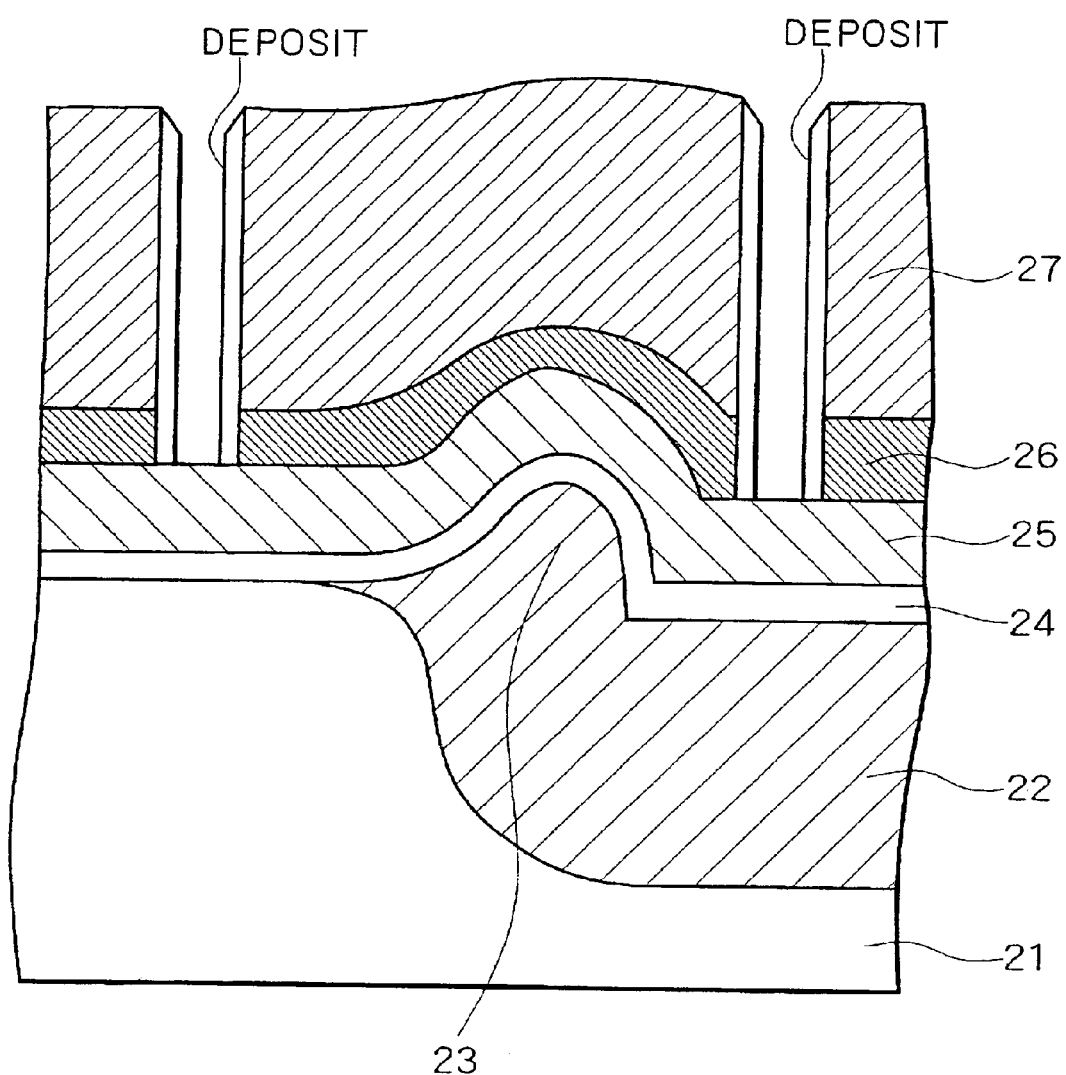
FIG. 5 is a view showing a state that the anti-reflection film is etched.

FIG. 5 is a view showing a state that the anti-reflection film is etched.

The anti-reflection film 26 is etched by an etching system of an MCR (Magnetic Confinement Reactor) type using an etching gas having a composition of $CF_4/Ar/CHF_3/O_2$=30/400/20/10 sccm (standard cubic centimeter/minute) under conditions with a pressure of 2.0 Pa, a source output of 1000 W, an RF bias of 50 W (450 kHz), a wafer temperature of 0° C., and an etching amount of 200 nm.

Under such conditions, an etching rate of the anti-reflection film 26 becomes 330 nm/min, and an etching selection ratio of the anti-reflection film 26 to the resist 27 becomes 2.0. The etching of the anti-reflection film 26 proceeds until opening portions formed in the anti-reflection film 26 reach an interface with the $SiO_2$ film 25. With this etching process, even a portion of the anti-reflection film 26, positioned over the device isolation region, that is, over the region of the device isolation oxide 22 on which both the anti-reflection film 26 and the resist 27 are thickly formed, can be perfectly etched.

The same etching procedure as that described above is repeated except that the etching amount of the anti-reflection film 26 is changed from 200 nm to 250 nm in order to examine a dependence of an over-etching amount on a line width of each opening portion formed in the anti-reflection film 26 by etching. As a result, it becomes apparent that an increment of the line width of each opening portion by addition of the etching amount of 50 nm is 0.01 $\mu$m or less, and that a difference between the line width of the opening portion formed in the portion of the anti-reflection film 26, positioned over the device isolation region on which both the anti-reflection film 26 and the resist 27 are thickly formed and the line width of the opening portion formed in the portion of the anti-reflection film 26, positioned over the device region on which both the anti-reflection film 26 and the resist 27 are thinly formed, is at a negligible level irrespective of the etching amount of the anti-reflection film 26.

As described above, in the case of etching the anti-reflection film 26 by using an etching gas having a composition containing a substituted hydrocarbon with a halogen, a carbon component derived from the substituted hydrocarbon with a halogen is formed as a carbonaceous deposit on the side walls of the opening portion of the resist 27 and on the side walls of the opening portion, formed by etching, of the anti-reflection film 26. The deposit acts as a side wall blocking film, to suppress extension of the opening portion of the resist 27 functioning as a mask in the subsequent step of etching the $SiO_2$ film 25, thus allowing anisotropic etching of the anti-reflection film 26. As a result, even if the thickness of each of the anti-reflection film 26 and the resist 27 is locally uneven by the presence of the head 23, it is possible to etch the anti-reflection film 26 with the resist taken as a mask while suppressing a variation in dimension of a pattern.

With respect to etching of an anti-reflection film, it is known that a composition of an etching gas exerts an effect on etching characteristics of the anti-reflection film such as an etching rate of the anti-reflection film and an etching selection ratio of the anti-reflection film to a resist film. Concretely, in the case of etching an anti-reflection film by using an etching gas containing oxygen, the etching of the anti-reflection film is accompanied by etching of a resist film, to cause a variation in pattern dimension.

An effect of a composition of an etching gas exerted on etching of an anti-reflection film will be described below.

First, an effect of a composition of an etching gas in which a composition ratio of a substituted hydrocarbon with a halogen becomes small and a composition ratio of oxygen becomes large, exerted on etching of an anti-reflection film will be described.

The anti-reflection film 26 having the same configuration as that described in the above-described embodiment is etched by the MCR type etching system using an etching gas having a composition of $CF_4/Ar/CHF_3/O_2$=30/400/15/15 sccm under the same conditions as those described in the above-described embodiment, that is, under conditions with a pressure of 2.0 Pa, a source output of 1000 W, an RF bias of 50 W (450 kHz), a wafer temperature of 0° C., and an etching amount of 200 nm.

Under such conditions, an etching rate of the anti-reflection film 26 becomes 420 nm/min, and an etching selection ratio of the anti-reflection film 26 to the resist 27 becomes 1.8. The etching of the anti-reflection film 26 proceeds until opening portions formed in the anti-reflection film 26 reach an interface with the $SiO_2$ film 25. With this etching process, even a portion of the anti-reflection film 26, positioned over the device isolation region, that is, over the region of the device isolation oxide 22 on which both the anti-reflection film 26 and the resist 27 are thickly formed, can be perfectly etched.

The same etching procedure as that described above is repeated except that the etching amount of the anti-reflection film 26 is changed from 200 nm to 250 nm in order to examine a dependence of an over-etching amount on a line width of each opening portion formed in the anti-reflection film 26 by etching. As a result, it becomes apparent that an increment of the line width of each opening portion by addition of the etching amount of 50 nm is 0.01 $\mu$m, and that a difference between the line width of the opening portion formed in the portion of the anti-reflection film 26, positioned over the device isolation region on which both the anti-reflection film 26 and the resist 27 are thickly formed and the line width of the opening portion formed in the portion of the anti-reflection film 26, positioned over the device region on which both the anti-reflection film 26 and the resist 27 are thinly formed, is little dependent on the etching amount of the anti-reflection film 26, and concretely becomes about 0.01 $\mu$m.

As described above, an etching rate of the anti-reflection film 26 and an etching selection ratio of the anti-reflection film 26 to the resist 27 can be changed by changing the composition ratio of oxygen contained in the etching gas containing the substituted hydrocarbon with a halogen.

Specifically, as the composition ratio of oxygen becomes larger, the side wall blocking effect by the deposit becomes lower and thereby the lateral extension of the opening portion of the resist 27 becomes larger. This means that the adjustment of the composition ratio of the substituted hydrocarbon with a halogen and the composition ratio of oxygen allows the control of an etching rate of the anti-reflection film 26, an etching selection ratio of the anti-reflection film 26 to the resist 27, and an etching selection ratio of the $SiO_2$ film 25 to the polysilicon film 24 by a combination of the side wall blocking effect by the deposit and the etching effect by oxygen radicals generated from oxygen contained in the etching gas.

Next, an effect of a composition of an etching gas containing no oxygen, exerted on etching of an anti-reflection film will be described.

Figure 6:
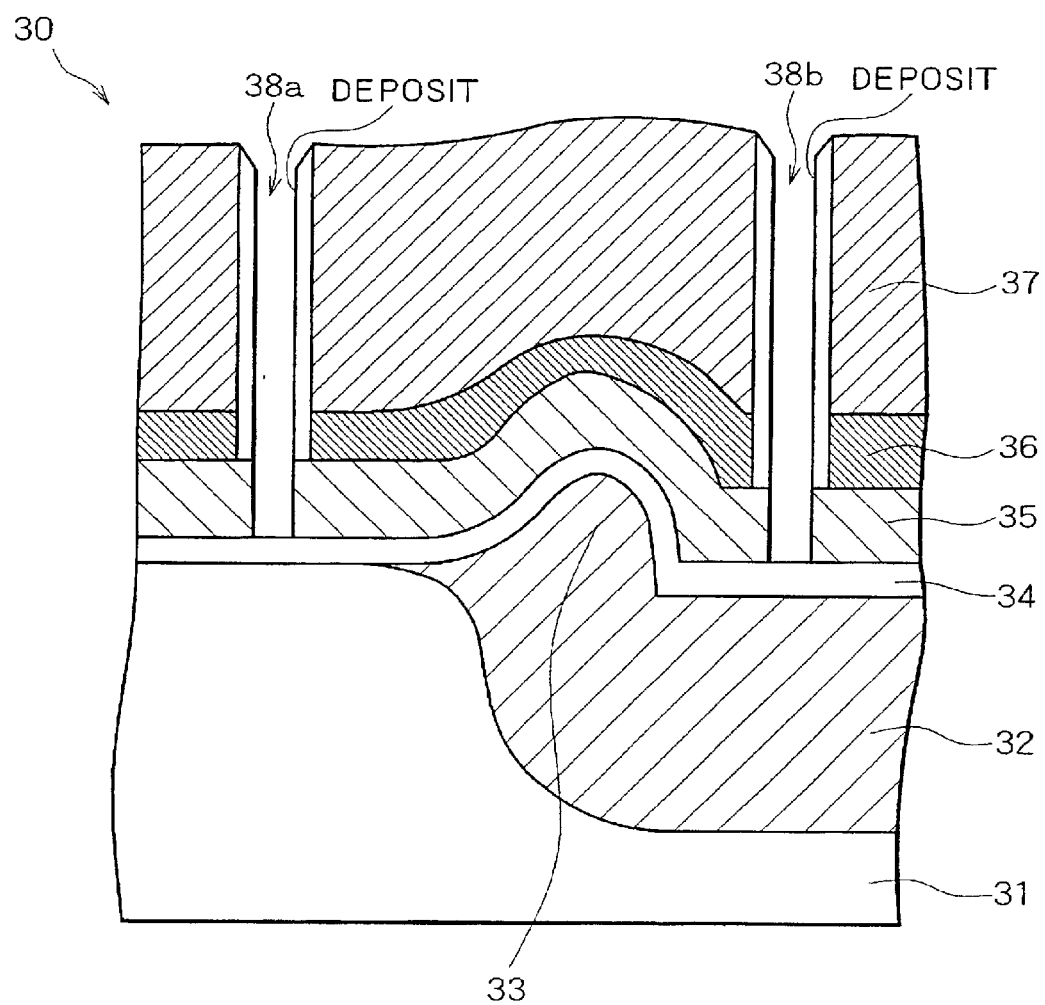
FIG. 6 is a sectional view fabricated by using an etching gas containing no oxygen.

FIG. 6 is a sectional view of a semiconductor device fabricated by using an etching gas containing no oxygen.

A semiconductor device 30 includes a silicon substrate 31, a device isolation oxide 32 formed in a surface region of the silicon substrate 31 by the LOCOS process, a head 33 formed on the device isolation oxide 32, a polysilicon film 34 formed on both the silicon substrate 31 and the device isolation film 32 by the low pressure CVD process, an $SiO_2$ film 35 formed on the polysilicon film 34 by the normal pressure CVD process, an anti-reflection film 36 formed on the $SiO_2$ film 35 by the spin coat process, a resist 37 coated on the anti-reflection film 36, an opening portion 38a formed in a region, which is thin by the presence of the head 33, of the resist 37, and an opening portion 38b formed in a region, which is thick by the presence of the head 33, of the resist 37.

The anti-reflection film 36 is etched by the MCR type etching system using an etching gas having a composition of $CF_4$/Ar/$CHF_3$/$O_2$=30/400/30/0 sccm under conditions with a pressure of 0.2 Pa, a source output of 1000 W, an RF bias of 50 W (450 kHz), a wafer temperature of 0° C., and an etching amount of 500 nm.

At the time of etching of the anti-reflection film 36, a carbon component derived from the substituted hydrocarbon with a halogen contained in the etching gas is formed as a carbonaceous deposit on side walls, less irradiated with ions, of each opening portion. The deposit acts as a side wall blocking film, to suppress extension of each opening portion of the resist 37 functioning as a mask in the subsequent step of etching the $SiO_2$ film 35, thus allowing anisotropic etching of the anti-reflection film 36.

In the case using the etching gas containing no oxygen as shown in the above conditions, an etching rate of the anti-reflection film 36 becomes 60 nm/min, and an etching rate of the resist 37 becomes 40 nm/min, each of which is lower than that in the case using the etching gas containing oxygen. Meanwhile, an etching selection ratio of the $SiO_2$ film 35 to the polysilicon film 34 is 20 or more. To be more specific, since the deposit formed at the time of etching acts as the side wall blocking film and thereby allows etching of the anti-reflection film 36 without lateral extension of each opening portion of the resist 37, the anti-reflection film 36 can be etched without changing a dimension of a line width, and further, since the etching selection ratio of the $SiO_2$ film 35 to the polysilicon film 34 is high, the $SiO_2$ film 35 is anisotropically etched until an interface with the polysilicon film 34, and the polysilicon film 34 is little etched.

Finally, the anti-reflection film 36, the resist 37, and the carbonaceous deposit are perfectly removed by, for example, ashing using oxygen plasma.

As described above, the etching rate of the anti-reflection film 36, and the etching selective ratio of the anti-reflection film 36 to the resist 37 can be changed by changing a composition ratio of oxygen contained in the etching gas containing the substituted hydrocarbon with a halogen. Further, after the etching of the anti-reflection film 36, the underlying $SiO_2$ film 35 can be continuously etched. As a result, the anti-reflection film 36 and the $SiO_2$ film 35 can be continuously etched by using the same etching system.

The composition ratio of each component in the etching gas described above is for illustrative purposes only. For example, although the etching gas containing $CF_4$, Ar, $CHF_3$, and $O_2$ is used in the above-described embodiment, Ar may be replaced with another inactive gas, and the substituted hydrocarbon with a halogen is not limited to $CF_4$ and $CHF_3$ but may be freely selected from other substituted hydrocarbons with halogens, which generate fluorine radicals or chlorine radicals at the time of etching, for example, $C_4F_8$, $C_2F_6$, $CHCl_3$, $CH_2F_2$, and $CCl_4$. Further, the composition ratio of oxygen in the etching gas may be freely set on the basis of a desired etching rate and an allowable variation in pattern dimension.

In addition, the MCR type etching system used for etching in the above-described embodiment may be replaced with another etching system capable of generating a high density plasma, such as an RF bias applying type ECR (Electron Cyclotron Resonance) plasma etching system or a helicon wave plasma type etching system.

While the preferred embodiment of the present invention has been described using specific terms, such description is for illustrative purposes, and it is to be understood that changes and variations may be made without departing from the sprit or scope of the following claims.

What is claimed is:

1. A method of fabricating a semiconductor device, in which an anti-reflection film is etched with a resist taken as a mask, comprising:
   forming a device isolation oxide on a wafer substrate;
   forming a polysilicon film on both the wafer substrate and the isolation oxide;
   forming an insulation film on the polysilicon film;
   forming an anti-reflection film on said insulating film;
   forming a resist on said anti-reflection film and forming an initial opening portion in said resist;
   removing a portion, positioned at said initial opening portion of said anti-reflection film by etching, using an etching gas containing a substituted hydrocarbon with a halogen, such that an interfacing surface of the insulating layer is exposed, thus forming a deepened opening portion, the deepened opening portion comprising the initial opening portion;
   forming a side wall blocking film on side walls of said deepened opening portion to suppress extension of said deepened opening portion, the side wall blocking film having a thickness;
   removing a portion, positioned at said deepened opening portion, of the insulating film by etching, thus forming a further deepened opening portion,
   wherein a width of the deepened opening portion is greater than a width of the further deepened opening portion by an amount equal to twice the thickness of the side wall blocking film, and
   wherein the wafer substrate is not etched during the aforementioned steps.

2. A method of fabricating a semiconductor device according to claim 1, wherein said substituted hydrocarbon with a halogen is at least one gas selected from a group consisting of tetrafluoromethane ($CF_4$), octafluorobutane ($C_4F_8$), hexafluoroethane ($C_2F_6$), trichloromethane ($CHCl_3$), trifluoromethane ($CHF_3$), difluoromethane ($CH_2F_2$), and tetrachloromethane ($CCl_4$).

3. A method of fabricating a semiconductor device according to claim 1, wherein said etching gas contains oxygen; and wherein etching characteristics are controlled by changing a composition ratio of said substituted hydrocarbon with a halogen contained in said etching gas and a composition ratio of oxygen contained in said etching gas.

4. A method of fabricating a semiconductor device according to claim 1, wherein said anti-reflection film and said insulating film are continuously etched in the same etching system, and wherein said thickness is substantially constant from a top of the side wall blocking film to a bottom of the side wall blocking film.

5. A method of fabricating a semiconductor device, in which an anti-reflection film is etched with a resist taken as a mask, comprising:

forming a device isolation oxide on a wafer substrate, said device isolation oxide having a total width and, in a head area of the oxide, a head;

forming a polysilicon film on the device isolation oxide;

forming an insulating film on the polysilicon film at a device isolation region of the semiconductor device coinciding with a location of the head;

forming an anti-reflection film on said insulating film;

forming a resist on said anti-reflection film and forming an initial opening portion in said resist;

wherein a thickness of a portion of the resist and said anti-reflection film over the device isolation region is greater than over another region of the semiconductor device due to presence of said head; and forming a deepened opening portion by removing a portion, positioned at said initial opening portion of said resist, of said anti-reflection film by etching using an etching gas containing a substituted hydrocarbon with a halogen;

wherein said deepened opening portion is disposed in said another region of the semiconductor device which is not over said head;

wherein, in the removing step, a side wall blocking film is formed on walls of the deepened opening portion to allow anisotropic etching of the anti-reflection film; and wherein the wafer substrate is not etched during or proximate any of the stated steps.

* * * * *